(12) United States Patent
Bonucci et al.

(10) Patent No.: US 8,541,936 B2
(45) Date of Patent: Sep. 24, 2013

(54) COMPOSITE LAYER CONTAINING A LAYER OF PHOSPHORS AND RELATED ELECTROLUMINESCENT DEVICE

(75) Inventors: Antonio Bonucci, Milan (IT); Alessio Corazza, Como (IT); Paolo Vacca, Rome (IT)

(73) Assignee: Saes Getters S.p.A., Lainate (MI) (IT)

( * ) Notice: Subject to any disclaimer, the term of this patent is extended or adjusted under 35 U.S.C. 154(b) by 0 days.

(21) Appl. No.: 13/702,565

(22) PCT Filed: Jul. 4, 2011

(86) PCT No.: PCT/EP2011/061219
§ 371 (c)(1),
(2), (4) Date: Dec. 6, 2012

(87) PCT Pub. No.: WO2012/004222
PCT Pub. Date: Jan. 12, 2012

(65) Prior Publication Data
US 2013/0082587 A1    Apr. 4, 2013

(30) Foreign Application Priority Data
Jul. 7, 2010    (IT) .............................. MI2010A1250

(51) Int. Cl.
*H01J 5/16* (2006.01)
(52) U.S. Cl.
USPC .......................................... 313/116; 313/501
(58) Field of Classification Search
USPC ................................. 313/116, 501
See application file for complete search history.

(56) References Cited

U.S. PATENT DOCUMENTS

| | | | |
|---|---|---|---|
| 6,791,259 B1 * | 9/2004 | Stokes et al. .................. | 313/503 |
| 2007/0007876 A1 | 1/2007 | Chung et al. | |
| 2007/0103058 A1 | 5/2007 | Young | |
| 2009/0026952 A1 | 1/2009 | Ahn | |
| 2009/0050848 A1 | 2/2009 | Kim et al. | |
| 2010/0032702 A1 * | 2/2010 | Lahijani ....................... | 257/98 |
| 2010/0060142 A1 * | 3/2010 | Itou et al. ...................... | 313/498 |

FOREIGN PATENT DOCUMENTS

| | | |
|---|---|---|
| EP | 1655793 | 5/2004 |
| JP | 2002-324506 | 11/2002 |
| JP | 2004-075908 | 3/2004 |
| JP | 2005-048107 | 5/2005 |
| JP | 2008-069290 | 3/2008 |
| JP | 2010-92791 | 4/2010 |
| WO | 2009/123498 | 8/2009 |

OTHER PUBLICATIONS

PCT International Search Report mailed on Feb. 29, 2012 for PCT/EP2011/061219 filed on Jul. 4, 2011 in the name of SAES Getters S.P.A.
PCT Written Opinion mailed on Aug. 13, 2012 for PCT/EP2011/061219 filed on Jul. 4, 2011 in the name of SAES Getters S.P.A.
PCT Written Opinion mailed on Feb. 29, 2012 for PCT/EP2011/061219 filed on Jul. 4, 2011 in the name of SAES Getters S.P.A.
PCT International Preliminary Report on Patentability with annexes mailed on Oct. 29, 2012 for PCT/EP2011/061219 filed on Jul. 4, 2011 in the name of SAES Getters S.P.A.
BCES: Modiule 3—Characteristics of Particles—Size Distribution retrieved on Aug. 24, 2012 from http://www.epa.gov/apti/bees/module3/distribu/distribu.htm.
Response to PCT Written Opinion mailed on Aug. 13, 2012 for PCT/EP2011/061219 filed on Jul. 4, 2011 in the name of SAES Getters S.P.A.
DuPont RPD-2 Rutile Paper Dry Titanium Dioxide, Dupont, 2005, 2 pages.
Module 3: Characteristics of Particles—Size Distribution, United States Environmental Protection Agency, www.epa.gov/apti/bces/module3/distribu/distribu.htm, retrieved Aug. 24, 2012, 6 pages.
Bakk, P. et al., The effect of contaminants on the mercury consumption of fluorescent lamps, J. Phys. D: Appl. Phys. 2009, 42: 095501-1-095501-6.
Guo, C., et al., Study on the stability of phosphor $SrAl_2O_4$:$Eu^{2+}$, $Dy^{3+}$ in water and method to improve its moisture resistance, Mat. Chem. and Phys. 2007, 106: 268-272.
Mishra, KC, et al., Investigation of Fluorescence Degradation Mechanism of Hydrated $BaMgAl_{10}O_{17}$:$Eu^{2+}$ Phosphor, J. Electrochem. Society 2005, 152: H183-H190.
Ropp, RC, The Chemistry of Artificial Lighting Devices—lamps, Phosphors and Cathode Ray Tubes, 1993, pp. 359-364.

* cited by examiner

*Primary Examiner* — Anh Mai
*Assistant Examiner* — Andrew Coughlin
(74) *Attorney, Agent, or Firm* — Steinfl & Bruno LLP

(57) ABSTRACT

Solutions to improve the properties of the phosphors and electroluminescent devices are described, using phosphors in combination with zeolites for converting UV or Blue radiation into visible radiation.

18 Claims, No Drawings

COMPOSITE LAYER CONTAINING A LAYER OF PHOSPHORS AND RELATED ELECTROLUMINESCENT DEVICE

CROSS REFERENCE TO RELATED APPLICATIONS

The present application is the US national stage of International Application PCT/EP2011/061219 filed on Jul. 4, 2011 which, in turn, claims priority to Italian Application MI2010A001250 filed on Jul. 7, 2010.

The present invention relates, in a first aspect thereof, to solutions for improving the properties of phosphors and, in a second aspect, to electroluminescent devices using phosphors for converting UV-visible radiation, with particular reference to UltraViolet (UV) or Blue radiation, into light radiation suitable to be used therein.

Even if the invention has its main industrial application in the devices based on the conversion to white radiation, it can be advantageously used if the conversion of interest consists in a narrow-band radiation selected in the visible spectrum (i.e. a colored radiation).

Phosphors for converting UV radiation are used in various devices, among the most common of which there are are the discharge lighting lamps, fluorescent lamps, white phosphor LEDs and displays for viewing information, particular reference being made to the plasma displays.

One of the problems to be faced with the phosphors is their possible degradation as a consequence of interacting with $H_2O$ within the device where the same are used. More information on the effects of $H_2O$ being present on the phosphors can be found in the article by Mishra et al. "Investigation on fluorescence degradation mechanism of hydrated $BaMgAl_{10}$: $Eu^{2+}$ phosphor", published in 2005 on the Journal of Electrochemical Society, No. 152, pages 183-190. In order to solve this problem, the use of zeolites as phosphors has been described in the Patent Application published as JP2008069290, wherein the fluorescent substance consists in ion-exchanged zeolites with Rare-Earth ions coming from a salt solution. In this Patent Application the zeolites were crystallized in a hexagonal plate-shape since fluorescent nanozeolites (i.e. zeolite particles with nanometer dimensions not only in one direction) are described as not efficient in the emission conversion of the light radiation. Moreover the Patent Application JP2008069290 requires that zeolites have at least a 20% ion-exchange rate.

The International patent application WO2009/123498 tackles the problem of degradation of the phosphors by means of employing zeolites and nanostructured metal oxides, while the article by Guochofeng et al. "Study on the stability of phosphor $SrAl_2O_4$, $Eu^{2+}$, $Dy^{3+}$, in water and method to improve its moisture resistance" published in 2007 on Material Chemistry and Physics, No. 106, pages 268-272 suggests the coating of phosphors with barrier materials.

The use of nanostructured $H_2O$ getters within an electroluminescent organic device is instead disclosed in the patent application published as EP1655792, wherein the use of a transparent layer for the removal of $H_2O$ is described, consisting of metallic salts or oxides having dimensions of less than 100 nm in order to ensure thereby its transparency.

The object of the present invention is that of improving the properties of the phosphors, not only by facing the problem of degradation due to the presence of $H_2O$, but also by enhancing the quality of the radiation emitted by the phosphors, and in a first aspect thereof consists in a composite layer for converting a radiation (in the most general case with wavelength in the range 210 nm to 800 nm) into visible radiation, containing a layer of phosphors combined with zeolites of nanometric size, characterized in that 95% of these nanometric zeolites have dimensions between 60 and 400 nm.

Generally speaking, whenever the description will refer to the particle size, it will be meant that at least 95% of the particles are comprised in the dimensional range as specified.

In particular the inventors have found that by using a specific category of $H_2O$ absorbers, namely the zeolites, having a given (nanometric) particle size, not only the life thereof is prolonged, but also the emission properties of the phosphors are improved.

What is important is that most of the zeolites have the specified dimensions, while it is acceptable that a small fraction, less than 5%, has dimensions outside the defined range, i.e. 60-400 nm.

With reference to the ways of using them, the nanozeolites may be deposited by means of a suitable dispersant, such as water, methanol, isopropyl alcohol, ethyl cellulose, n-butanol, xylene, hydroxypropylmethylcellulose, polyvinylpyrolidone, polyvinylmethylether, polyacrylic acid, polyethylene oxide, all of them being subsequently mostly removed by means of a curing treatment. Alternatively the nanozeolites may be used dispersed in a polymeric matrix, necessarily transparent, that is a matrix transmitting at least 90% of the incident radiation, transparency to be ensured also in the UV region. In this case the use of a polydialkylsiloxane resin is preferred. The nanozeolites may also be dispersed alternatively with an inorganic binder such as alumina or alumina coated spheres of silica.

In particular three possible preferred embodiments have been found, each of which provides for special advantages.

According to the first of them, the zeolites are mixed with the phosphors; in this case an improvement of the light emission uniformity has been observed and also a slight increase thereof. In this embodiment the preferred size of the nanozeolites is comprised between 80 and 150 nm and the best results are particularly obtained with a particle distribution having a peak at about 100 nm, i.e. with the 95% of zeolites within the range 90-110 nm.

According to a second embodiment the nanozeolites are formed as a layer positioned over the phosphors, thus resulting in a covering layer facing toward the inside of the device.

This particular configuration is especially advantageous in those devices where mercury is present, such as fluorescent lamps, since the layer of nanozeolites carries out its protective function from both $H_2O$ and the mercury vapors which also can cause the phosphors degradation, as shown in the patent application US 2009/0050848, that discloses protective layers without however considering the effects linked to the size selection of the particles used for making the layer.

Therefore the use of the nanometric zeolites according to the present invention allows also for the additional effect of reducing the mercury consumption due to the water being present and its degradation products ($OH^+$ and $H^-$ radicals). This interaction mechanism between mercury and water and its derivatives, as described in the article "The effect of contaminants on the mercury consumption of fluorescent lamps" published by I. Bakk et al. on J. Phys.D: Appl. Phys. 42 (2009) 095501, not only involves the necessity of using an undesired higher quantity of Hg, but also a reduction of the luminous intensity as compared to the initial values. According to the present invention, in this embodiment the preferred size of the nanozeolites is comprised between 250 and 350 nm. In particular the best results are achieved with a distribution of particles having a peak at around 300 nm, i.e. wherein the 95% of the nanozeolites is in the range 280-320 nm.

A third variant provides instead that the layer of nanozeolites is placed under the layer of phosphors, thus acting as an intermediate layer between the surface, generally vitreous and transparent, of the device and the layer of phosphors, which thereby is no longer directly in contact with the inner side of the device. In this case the nanozeolites can also be mixed with particles of alumina or other oxides to add a protection functionality for the glass. The advantage in this case is double: on one hand a barrier against water is formed, provided by the glass outgassing, thus protecting the phosphors, and in addition to this effect also in this case it has been surprisingly found that the use of nanozeolites with particle size between 80 and 400 nm (therefore, as previously explained, the 95% of the zeolites employed having a size comprised in this range) provides advantages referred to the intensity of the light emission. These effects in this specific configuration are more evident with nanozeolites having dimensions comprised between 60 and 100 nm. In particular the best results are achieved with a distribution of particles having a peak at around 80 nm, i.e. with the 95% of the nanozeolites in the range 70-90 nm.

The use of the preferred particle size for the three different configurations shows that there are advantages and unexpected effects also resulting from any possible combination between the above-mentioned embodiments and particle size of the nanozeolites.

The above described three embodiments can be variously combined with one another: e.g. the layer of phosphors can be provided between two layers of nanozeolites, the first of which operates as an interface between the phosphors and the surface of the device, and the second one as interface between phosphors and the inner atmosphere of the device.

Among the preferred methods for making the layer of nanozeolites there are the techniques of spray coating, dip coating or spray drying (to be seen e.g. the technique of phosphors deposition described at p. 363 of "The Chemistry of Artificial Lighting Devices—lamps, Phosphors and Cathode Ray Tubes", R. C. Ropp, ed. Elsevier 1993).

A curing or Lehring process (heating in air flow) can be associated to these deposition methods and it is directed to remove the dispersant in those embodiments of the present invention considering the use of a dispersant, or in some cases to polymerize the polymeric matrix if the nanozeolites are dispersed in a matrix that is not fully cross-linked or comprises a precursor of the polymeric matrix. In some embodiments the purpose of the curing process is double, i.e. the dispersant removal and the setting of the polymer matrix containing the nanozeolites.

In a second aspect thereof the invention consists in an electroluminescent device comprising a composite layer for converting UV or Blue) radiation into visible radiation, containing a layer of phosphors combined with nanozeolites of nanometric size, characterized in that 95% of these nanometric zeolites have dimensions between 60 and 400 nm.

Among the most interesting devices to which the object of the present invention is applied there are displays for viewing information, with particular reference to plasma displays, fluorescent lamps, discharge lamps and white phosphor LEDs.

EXAMPLE 1

A paint of commercial Triband Phosphors for fluorescent lamp $(BaMg_2Al_{16}O_{27}:Eu^{2+}(Ce_{0.67}Tb_{0.33})MgAl_{11}O_9$ $(Y_{0.9}Eu_{0.11})_2O_3$ has been prepared mixing 400 g of phosphors in deionized water containing 2 w/w % resin (POLYOX WSR N-750, Dow Chemical Company), 0.5 g of surfactant (TERGINOL NP-6, Dow Chemical Company), 10 g of triethanolamine and 0.1 g of organic defoamer (commercially available with the tradename SAG 275B). The paint has been deposited on a planar glass substrate by spray coating and heated for 5 min at 350° C., in order to obtain a layer with thickness of 15 nm (sample 1) The conversion efficiency of a phosphor layer has been measured by a spectrofluorimeter with an integrating sphere excited by UV at 254 nm. The measured conversion efficiency has been about 60%.

Other two samples have been prepared by adding a covering layer on the phosphor layer. Sample 2 has been obtained using a covering layer with a thickness of 800 nm of zeolites of nanometric size, having a peaked dimension at 300 nm. Sample 3, instead, has been obtained depositing a covering layer with a thickness of 4 micron consisting of zeolites having an average size of 2 micron. For both the samples, the deposition method of the zeolites has been the commonly known doctor blading technique of an aqueous dispersion of the zeolites (concentration about 10% w/w), followed by a consolidation treatment at the temperature of 100° C. for 30 minutes.

The measured conversion efficiency of the sample 2 results in an improvement of more than 10% with respect to the efficiency observed with the sample 1, whereas the measured conversion efficiency of the sample 3 consists in a reduction of more than 10% with respect to the sample 1. Results have been summarized in Table 1.

TABLE 1

|  | Zeolite dimensions | Thickness of zeolite layer | relative variation of conversion efficiency (respect sample 1) |
| --- | --- | --- | --- |
| sample 2 (inventive) | Peaked at 300 nm | 800 nm | increase 11% |
| sample 3 (comparative) | Average size 2 μm | 4 μm | decrease 12% |

The invention claimed is:

1. A composite layer for conversion of UV or blue radiation into a visible radiation, containing a layer of phosphors combined with zeolites of nanometric size, wherein at least 95% of the nanometric zeolites have dimensions between 60 and 400 nm.

2. The composite layer according to claim 1 wherein said nanometric zeolites are dispersed in a transparent polymeric matrix.

3. The composite layer according to claim 1 wherein said nanometric zeolites are uniformly dispersed with the phosphors.

4. The composite layer according to claim 3 wherein at least 95% of said nanometric zeolites have dimensions comprised between 80 and 150 nm.

5. The composite layer according to claim 4 wherein at least 95% of said nanometric zeolites have dimensions comprised between 90 and 110 nm.

6. The composite layer according to claim 1 wherein said nanometric zeolites form a covering layer positioned over said layer of phosphors.

7. The composite layer according to claim 6 wherein at least 95% of said nanometric zeolites have dimensions comprised between 250 and 350 nm.

8. The composite layer according to claim 7 wherein at least 95% of said nanometric zeolites have dimensions comprised between 280 and 320 nm.

9. The composite layer according to claim 1 wherein said nanometric zeolites form an intermediate layer positioned between said layer of phosphors and a transparent substrate.

10. The composite layer according to claim 9 wherein at least 95% of said nanometric zeolites have dimensions comprised between 60 and 100 nm.

11. The composite layer according to claim 10 wherein at least 95% of said nanometric zeolites have dimensions comprised between 70 and 90 nm.

12. An electroluminescent device comprising a composite layer for conversion of UV or blue radiation into a visible radiation, containing a layer of phosphors combined with zeolites of nanometric size wherein at least 95% of the nanometric zeolites have dimensions between 60 and 400 nm.

13. The electroluminescent device according to claim 12 wherein said nanometric zeolites form a covering layer positioned over said layer of phosphors, said covering layer facing the inside of the device.

14. The electroluminescent device according to claim 12 wherein said nanometric zeolites form an intermediate layer positioned between said layer of phosphors and a transparent substrate.

15. The electroluminescent device according to claim 12 wherein said electroluminescent device is a plasma display.

16. The electroluminescent device according to claim 12 wherein said electroluminescent device is a fluorescent lamp.

17. The electroluminescent device according to claim 12 wherein said electroluminescent device is a discharge lamp.

18. The electroluminescent device according to claim 12 wherein said electroluminescent device is a phosphor white LED.

* * * * *